United States Patent
Kadota et al.

(10) Patent No.: US 6,534,895 B2
(45) Date of Patent: Mar. 18, 2003

(54) SURFACE ACOUSTIC WAVE DEVICE, SHEAR BULK WAVE TRANSDUCER, AND LONGITUDINAL BULK WAVE TRANSDUCER

(75) Inventors: Michio Kadota, Kyoto (JP); Toshinori Miura, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/842,330

(22) Filed: Apr. 24, 2001

(65) Prior Publication Data

US 2001/0035695 A1 Nov. 1, 2001

(30) Foreign Application Priority Data

May 1, 2000 (JP) ......................... 2000-132565

(51) Int. Cl.[7] ........................... H03H 9/25; H01L 41/047
(52) U.S. Cl. ..................... 310/313 A; 310/363
(58) Field of Search .............................. 310/313 A, 363

(56) References Cited

U.S. PATENT DOCUMENTS 5,426,340 A * 6/1995 Higaki et al. ............ 310/313 R

FOREIGN PATENT DOCUMENTS

| JP | 8-162881 | 6/1996 | ............ H03H/9/08 |
| JP | 8-228398 | 9/1996 | ............ H04R/17/00 |

* cited by examiner

Primary Examiner—Thomas M. Dougherty

(57) ABSTRACT

A surface acoustic wave device includes a substrate and electrode disposed on the substrate. The electrode has a specific resistance $\rho$ of up to about 1 $\Omega \cdot$cm and is made of a ZnO film with a low resistance having an impurity doping. A piezoelectric film having a specific resistance $\rho$ of at least about $10^6$ $\Omega \cdot$cm and a lattice constant within approximately $\pm 20\%$ of that of ZnO is disposed on the electrode. An interdigital electrode is disposed on the piezoelectric film.

11 Claims, 4 Drawing Sheets

SURFACE ACOUSTIC WAVE DEVICE, SHEAR BULK WAVE TRANSDUCER, AND LONGITUDINAL BULK WAVE TRANSDUCER

BACKGROUND OF THE INVENTION

1. Field of the Invention

The present invention relates to a surface acoustic wave device, a shear bulk wave transducer, and a longitudinal bulk wave transducer, each having a ZnO film with a low resistance disposed on a substrate so as to function as an electrode.

2. Description of the Related Art

The Japanese Unexamined Patent Application Publication No. 8-162881 discloses a surface acoustic wave filter having a ZnO layer as an electrode in which the resistance is decreased by doping with an impurity. According to the method of producing a surface acoustic wave filter described in the above-identified Japanese Unexamined Patent, a ZnO layer is provided on a substrate, and ions are implanted in the ZnO layer, so that the impurity dopes the ZnO in an area near the boundary between the substrate and the ZnO layer, and thus, a ZnO layer with a low resistance is provided. Moreover, the above-mentioned ZnO layer with a low resistance is utilized as an interdigital electrode. That is, the surface acoustic wave device includes an interdigital electrode made of ZnO having a low resistance disposed on the substrate, and a ZnO layer, as a piezoelectric layer, is provided on the interdigital electrode.

On the other hand, the Japanese Unexamined Patent Application Publication No. 8-228398 discloses a shear bulk wave transducer using an ZnO layer with a low resistance as well.

A ZnO layer with a low resistance, arranged to function as an electrode, is disposed on a substrate made of an R-plane [(01$\bar{1}$2) plane] sapphire. A second ZnO layer with a high resistance is arranged as an epitaxial film on the first ZnO layer. An electrode is disposed on the second ZnO layer.

In both of the surface acoustic wave filter and the shear bulk wave transducer described in the Japanese Unexamined Patent Application Publication No. 8-162881 and the Japanese Unexamined Patent Application Publication No. 8-228398, the ZnO layer with a low resistance containing an impurity is arranged so as to be in contact with the ZnO layer the defines a piezoelectric film, and is used as an electrode.

Referring to the ZnO layer with a low resistance in the surface acoustic wave filter described in the Japanese Unexamined Patent Application Publication No. 8-162881, the specific resistance $\rho$ is low, that is, about $1 \times 10^{-3}$ $\Omega$·cm. However, the specific resistance is too high from the standpoint of a material for defining an interdigital electrode. Al and Au which are ordinary electrode materials for defining interdigital electrodes have a specific resistance of about $2 \times 10^{-8}$ $\Omega$·cm. For this reason, in the surface acoustic wave filter described in the Japanese Unexamined Patent Application Publication No. 8-162881, the interdigital electrode has a high resistance, and the insertion loss is large. Thus, the surface acoustic wave filter is unsuitable for practical use.

In addition, impurities doping by ion implanting likely causes a large stress in a film to be doped, and it is difficult to implant the impurities evenly in the film, which degrades the qualities of the doped film. Moreover, an ion implanting apparatus is relatively expensive.

On the other hand, the Japanese Unexamined Patent Application Publication No. 8-228398 discloses a process of forming a ZnO layer with a low resistance on a substrate by sputtering, using a target produced by doping a ZnO molding with an impurity such as Al. According to this process, the impurity can be distributed more uniformly, and the specific resistance $\rho$ can be effectively reduced, as compared with the method of producing the surface acoustic wave filter described in the Japanese Unexamined Patent Application Publication No. 8-1628881.

It should be noted that the Japanese Unexamined Patent Application Publication No. 8-228398 discloses only the shear bulk wave transducer in which the ZnO layer with a low resistance, the second ZnO layer with a high resistance, and the electrode are formed on the support made of the R-plane sapphire. No reference to a surface acoustic wave device using an interdigital electrode is made.

SUMMARY OF THE INVENTION

In order to overcome the problems and shortcomings of the prior art described above, preferred embodiments of the present invention provide a surface acoustic wave device including an electrode defined by a ZnO layer with a low resistance having an impurity doped therein, and having a greatly reduced insertion loss.

In addition, preferred embodiments of the present invention provide a shear bulk wave transducer and a longitudinal bulk wave transducer each of which uses different types of substrate materials and a ZnO layer with a low resistance.

According to a first preferred embodiment of the present invention, a surface acoustic wave device includes a substrate, an electrode disposed on the substrate and having a specific resistance of up to about 1 $\Omega$·cm, and including a ZnO layer with a low resistance being doped by an impurity, a piezoelectric film arranged as an epitaxial film on the electrode including the ZnO layer, and having a specific resistance $\rho$ of at least about $10^6$ $\Omega$·cm and a lattice constant within approximately ±20% of that of ZnO, and an interdigital electrode disposed on the piezoelectric film.

Preferably, the substrate is made of one of a material selected from the group consisting of R-plane, sapphire having a plane parallel to the c axis, Z-cut quartz, (111), (100), or (011) silicon, about 30° to 42°, rotated Y-plate LiNbO$_3$, about 30° to 42° rotated Y-plate LiTaO$_3$, and planes equivalent thereto.

Also preferably, the doping impurity is added at a ratio of approximately 3% to 5% by weight based on 100% by weight of ZnO.

Moreover, preferably, as the impurity, an atom or molecule belonging to group IIIA, IIIB, VA, or VB, and more preferably, at least one selected from the group consisting of Al, Ga, V, Nb, and As is used.

According to a second preferred embodiment of the present invention, a shear bulk wave transducer includes a substrate made of a material selected from the group consisting of approximately 30° to 42° rotated Y-plate LiNbO$_3$, and approximately 30° to approximately 42° rotated Y-plate LiTaO$_3$, an electrode disposed on the substrate and having a specific resistance $\rho$ of up to about 1 $\Omega$·cm, and including a ZnO layer with a low resistance having as an impurity an atom or molecule belonging to group IIIA, IIIB, VA, or VB, doping the ZnO, a piezoelectric film arranged as an epitaxial film on the electrode including the ZnO with a low resistance, and having a specific resistance $\rho$ of at least about $10^6$ $\Omega$·cm and a lattice constant within approximately ±20% of that of ZnO, and an electrode disposed on the piezoelectric film.

Preferably, as the impurity, at least one material selected from the group consisting of Al, Ga, V, Nb, and As is used.

According to a third preferred embodiment of the present invention, a longitudinal bulk wave transducer includes a substrate made of a material selected from the group consisting of c-plane sapphire, sapphire having a plane parallel to the c axis, (111), (110) or (011) silicon, and Z-cut quartz, and planes equivalent thereto, an electrode disposed on the substrate, having a specific resistance $\rho$ of up to about 1 $\Omega \cdot cm$, and made of a ZnO film with a low resistance having as an impurity an atom or molecule belonging to group IIIA, IIIB, VA, or VB, doping the ZnO, a piezoelectric film arranged as an epitaxial film on the electrode including the ZnO with a low resistance, and having a specific resistance $\rho$ of at least about $10^6$ $\Omega \cdot cm$, and a lattice constant within approximately ±20% of that of ZnO, and an electrode disposed on the piezoelectric film.

Preferably, as the impurity, at least one material selected from the group consisting of Al, Ga, V, Nb, and As is used.

Other features, elements, characteristics and advantages of the present invention will become more apparent from the following detailed description of preferred embodiments of the present invention.

DETAILED DESCRIPTION OF PREFERRED EMBODIMENTS

Hereinafter, the present invention will be made more apparent from the following description of preferred embodiments of the present invention made with reference to the drawings.

Figure 1A:
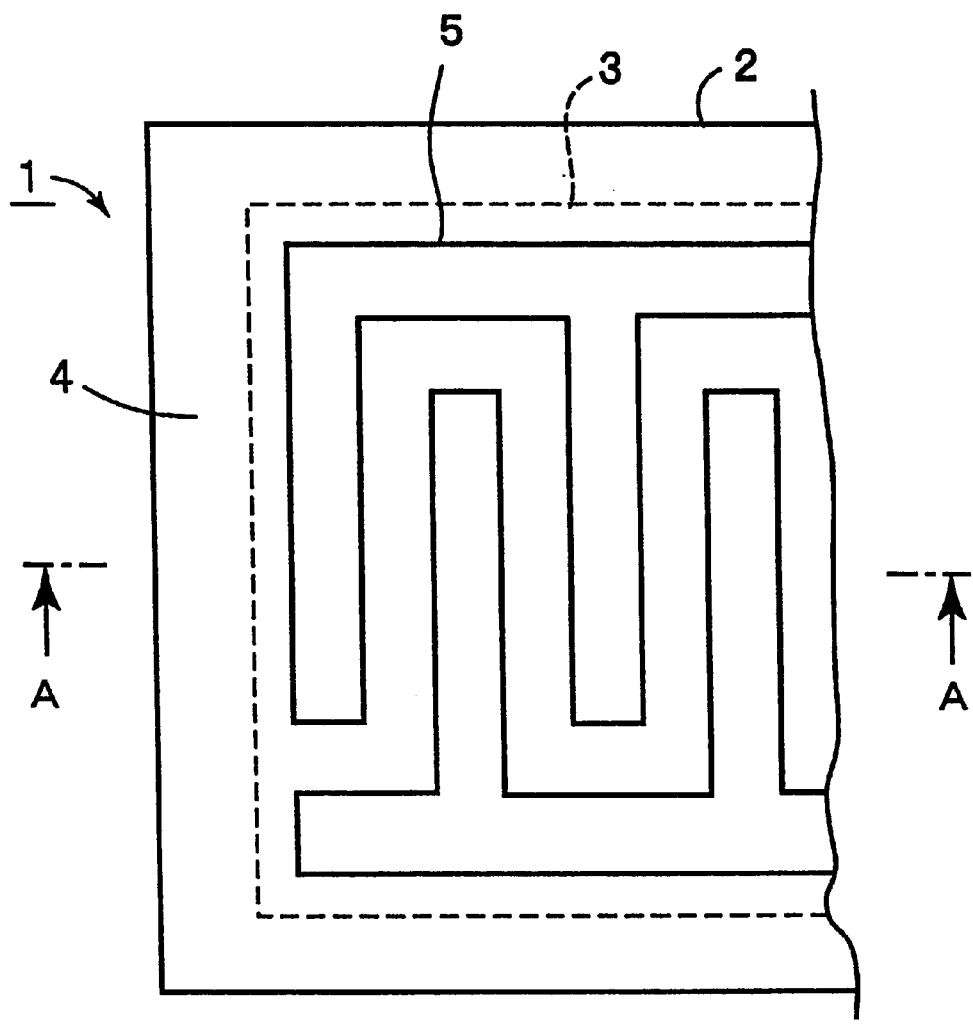
FIG. 1A is a plan view of a surface acoustic wave device utilizing a Sezawa wave according to a first preferred embodiment of the present invention.
Figure 1B:
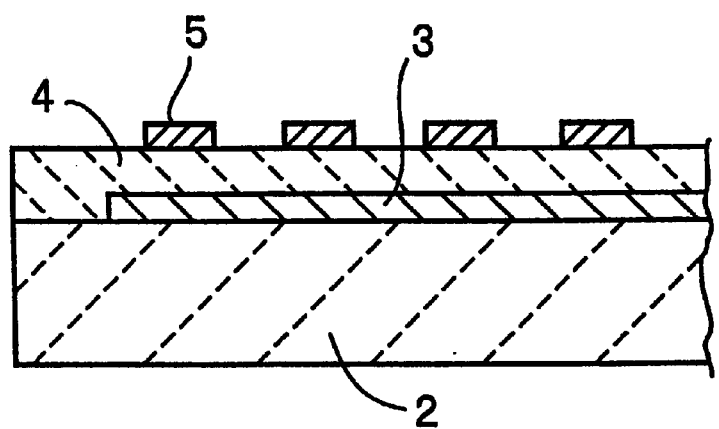
FIG. 1B is a partial cutaway cross sectional view taken along line A—A' in FIG. 1A.

FIGS. 1A and 1B are a plan view and a partial cutaway view illustrating a preferred embodiment of the surface acoustic wave device of the present invention.

In a surface acoustic wave device 1 utilizing a Sezawa wave, a ZnO film 3 with a low resistance is disposed on a substrate 2, and a piezoelectric film 4 is disposed on the ZnO film 3 with a low resistance. The ZnO film 3 with a low resistance functions as a short-circuit electrode. An interdigital electrode 5 is disposed on the piezoelectric film 4.

Referring to material for forming the substrate 2, materials on which the ZnO film 3 can be epitaxially grown, such as R-plane sapphire, sapphire having a plane parallel to the c axis (m-plane sapphire, a-plane sapphire, and so on), c-plane sapphire, z-cut quartz, approximately 30° to approximately 42° rotated Y-plate $LiNbO_3$, approximately 30° to approximately 42° rotated Y-plate $LiTaO_3$, (111), (100) or (011) silicon, or other suitable material may be used.

The resistance of the ZnO film 3 is decreased by doping the ZnO with an impurity. The ZnO film 3 is arranged to function as a short-circuit electrode. The impurity for doping the ZnO has no special limit. As the impurity, atoms or molecules belonging to the groups IIIA, IIIB, VA, and VB are exemplified. Examples of the impurity include Al, Ga, V, Nb, and As.

Referring to the content ratio of the impurity doping the ZnO, depending on a desired specific resistance $\rho$, preferably the ratio is up to about 5% by weight based on 100% by weight of ZnO. If the ratio exceeds about 5% by weight, the specific resistance is not decreased, but increased in some cases.

For this reason, the doping content is preferably about 0.3% to about 5% by weight based on 100% by weight of ZnO, and Al is preferably used as a dopant. In the case, the specific resistance of $3 \times 10-4\Omega$ cm can be obtained.

Referring to the formation of the ZnO film 3, preferably, a thin-film formation method is used. As the thin-film formation method, sputtering, CVD, or other appropriate methods may be used. In the case of formation of the ZnO film 3 via sputtering, the ZnO film 3 with a low resistance can be formed by use of a target which is formed by incorporating the impurities into the ZnO or a target which is formed by mixing ZnO powder with powder of an impurity. Regarding the ZnO film 3 with a low resistance, formed by sputtering or CVD, as described above, the specific resistance of the ZnO film with a low resistance can be effectively reduced, as compared with that of the ZnO film formed in the ion implantation method as described in the Japanese Unexamined Patent Application Publication No. 8-162881. For example, a specific resistance $\rho$ of about $1 \times 10^{-5}$ $\Omega \cdot cm$ can be achieved. The specific resistance of the ZnO film 3 is preferably about 1 $\Omega cm$ or less and more preferably about $8 \times 10^{-4}$ $\Omega cm$.

In contrast to the ion implantation method, an expensive, large-scale apparatus is not required. In addition, unnecessary processes are eliminated. Thus, the ZnO film 3 can be easily formed. Furthermore, regarding the ion implantation method, the distributions of implantation quantity are different in the upper and lower portions of the film. There exists a layer having a large specific resistance in a part of the film. The film has the defect in which that the insertion loss of SAW is increased, due to the large specific resistance.

After the ZnO film 3 is formed, the piezoelectric film 4 is formed. A material for forming the piezoelectric film 4 preferably has a specific resistance $\rho$ of at least about $10^6$ $\Omega \cdot cm$, and has no particular limitation, provided that the material can form a piezoelectric film having a lattice constant within about ±20% of that of the ZnO. Preferably, ZnO, AlN, or GaN are used.

The interdigital transducer 5 is formed on the piezoelectric film 4. The interdigital transducer 5 may be formed by use of an appropriate electrode material such as Al, Au, Cu, or other suitable material.

In the surface acoustic wave device 1 of this preferred embodiment of the present invention, the ZnO film 3 with a low resistance as a short-circuit electrode is provided on the substrate 2, and moreover, the piezoelectric film 4 and the interdigital electrode 5 are laminated. As a result of this structure, a surface acoustic wave device having a small insertion loss and a high efficiency are achieved.

Figure 2:
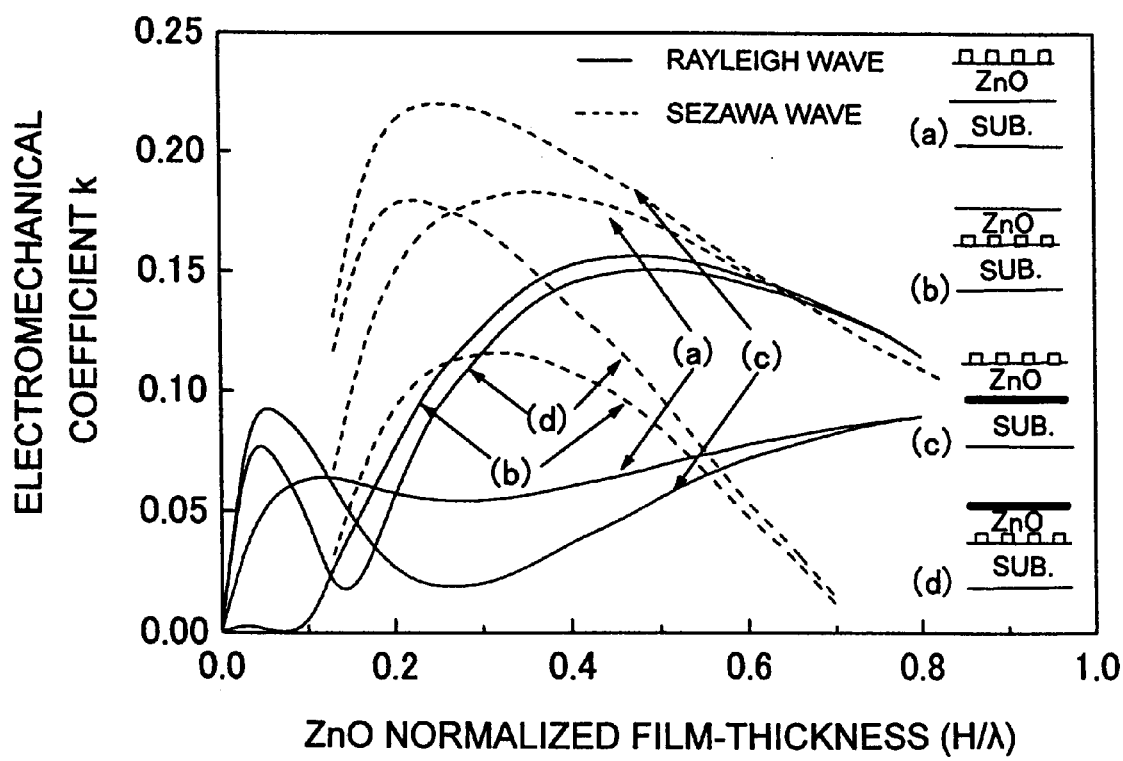
FIG. 2 illustrates relationships between the laminated structures of the surface acoustic wave devices utilizing different types of surface acoustic waves and the electromechanical coefficients k.

Referring to the surface acoustic wave devices utilizing a Sezawa wave, substrates having a high SAW velocity such as R-plane sapphire, c-plane sapphire, silicon, or other suitable materials are preferably used, and for the sheets thereof, four types of laminated structures, including (1) an IDT, a piezoelectric film, and a substrate, (2) an IDT, a piezoelectric film, a short-circuit film, and a substrate, (3) a piezoelectric film, an IDT, and a substrate, and (4) a short-circuit electrode, a piezoelectric film, an IDT, and a substrate have been conventionally known. FIG. 2 shows relationships between the electromechanical coefficients k and the normalized film-thicknesses H/λ of the ZnO films (H designates the film thickness of a ZnO film, and λ designates the wavelength of a surface acoustic wave), obtained when a ZnO film is used as the piezoelectric film in the above-mentioned structures. In particular, it is seen that in the above-described four types of laminated structures, the electromechanical coefficient k of the structure of (2), that is, that of the board structure including the IDT, the piezoelectric film, the short-circuit film, and the substrate, is largest, and thus, the conversion efficiency between electricity and SAW is high.

As conventionally known, when a piezoelectric film made of ZnO or other suitable material is formed on a substrate made of an R-plane sapphire, an epitaxial film having an orientation of (11$\bar{2}$0), (100), or (110) can be formed. However, when a short-circuit electrode is formed on a substrate of an R-plane sapphire by use of a metal material, a piezoelectric film such as an ZnO film or other suitable material formed on the short-circuit electrode fails to become an epitaxial film, but a film having an orientation of (0001) is formed. Accordingly, conventionally, the structure of example (1), that is, the laminated structure of the board including the IDT, the piezoelectric film and the R-plane sapphire is used, though the electromechanical coefficient k is small. In the case of the a-plane sapphire and the c-plane sapphire, an epitaxial piezoelectric film having an orientation of (0001) is formed on the sapphire substrate. However, only a piezoelectric film that is polycrystalline and has an orientation of (0001) is formed on a metal electrode. The electromechanical coefficient of SAW is small, and the propagation loss is large.

On the other hand, the inventor of this application has discovered that when the ZnO film 3 with a low resistance having an impurity doped therein is formed on a substrate made of R-plane sapphire, as described above, the ZnO film 3 with a very low resistance, that is, a specific resistance ρ of about $10^{-5}$ Ω·cm can be produced, and moreover, a ZnO film, if it is applied on the ZnO film 3 at a heating temperature of the substrate 2 of at least about 200°, can be formed as an epitaxial film.

The present preferred embodiment is made based on the above discovery. When the ZnO film 3 with a low resistance is formed on the substrate 2, the piezoelectric film 4 made of ZnO or other suitable material can be formed as an epitaxial film. Accordingly, a surface acoustic wave device having an excellent conversion efficiency and a low insertion loss can be provided by utilization of the laminated structure of example (2) having a large electromechanical coefficient as described above.

Crystallinities of the low-resistance ZnO film 3 on an R-plane sapphire, and the ZnO film 4 on the ZnO film 3 which provided on the R-plane sapphire were examined by RHEED photographs. It is found by the RHEED photographs that the ZnO film 3 and the ZnO film 4 are epitaxial films.

The film-forming conditions of the ZnO film 3 with a low resistance and the ZnO film as the piezoelectric film 4 are as follows.

(a) Film-forming Method and Conditions of ZnO Film 3

RF magnetron sputtering, target containing about 1% of Al doping the Zn, substrate heating temperature of about 250° C., RF power of 1 KW, introduction gas of Ar+$O_2$, gas pressure of approximately $7\times10^{-3}$ Torr (b) Film-forming Method and Conditions of ZnO Film as Piezoelectric Film 4

Figure 3:
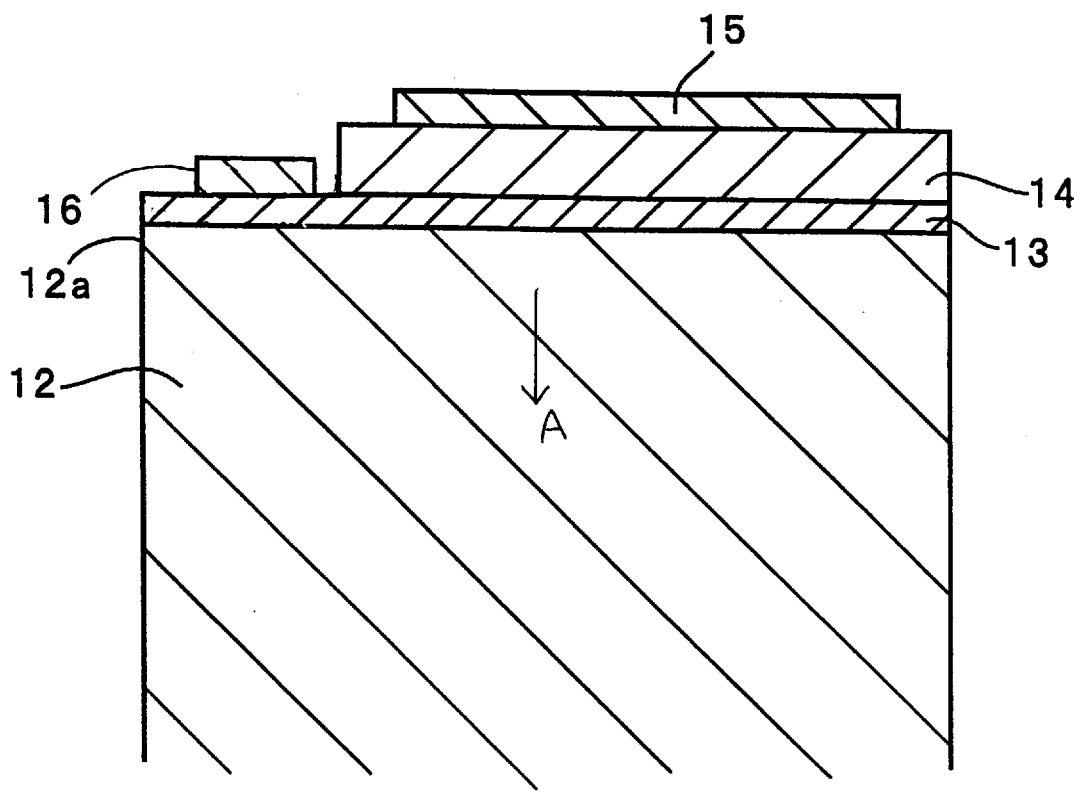
FIG. 3 is a cross sectional side view showing a shear bulk wave transducer according to a second preferred embodiment of the present invention.

Rf magnetron sputtering, 99.99% Zn target, substrate heating temperature of about 200° C., RF power of 1 KW, introduction gas of Ar+$O_2$, gas pressure of approximately $7\times10^{-3}$ Torr FIG. 3 is a cross sectional view of a shear bulk wave transducer according to another preferred embodiment of the present invention.

In a shear bulk wave transducer 11, a ZnO film 13 with a low resistance is disposed on a substrate 12, and a piezoelectric film 14 with a high resistance is disposed on the ZnO film 13 with a low resistance. A metal electrode 15 is disposed on the piezoelectric film 14. A metal electrode 16 is disposed on the ZnO film 13 with a low resistance so as to be separated from the piezoelectric film 14 and extend along one end 12a of the substrate 12.

In the shear bulk wave transducer 11, a transverse bulk wave is propagated in the direction indicated by the arrow A when an AC voltage is applied across the electrode 15 and 16. That is, an input signal can be converted to a shear bulk wave.

The substrate 12 is provided in order to propagate a transverse bulk wave, as described above. Accordingly, the substrate 12 may be made of a material on which a transverse bulk wave can be propagated. For example, the substrate 12 can be made of, about 30° to about 42° rotated Y-plate $LiNbO_3$, and about 30° to about 42° rotated Y-plate $LiTaO_3$. That is, in the shear bulk wave transducer described in the above-described Japanese Unexamined Patent Application Publication No. 8-22838, a substrate made of R-plane sapphire is used. In the shear bulk wave transducer 11 of the present preferred embodiment, the substrate 12 as a support can be formed by use of the above-described various substrate materials. The R-plane sapphire is pulled in a sheet-shape to be grown. Thus, a substrate with a size of at least about 30 mm generally required for a shear bulk wave transducer has to be produced in another method. Disadvantageously, the substrate 12 becomes expensive. Moreover, it has been found that regarding the ZnO film with a low specific resistance having an impurity doped therein, each of the, approximately 30° to approximately 42° rotated Y-plate $LiNbO_3$, and the approximately 30° to approximately 42° rotated Y-plate $LiTaO_3$ can be oriented more easily than the R-plane sapphire (⅔ of the width at half maximum in XRD).

Also in the present preferred embodiment, the ZnO film 13 with a low resistance is formed on the substrate 12 similarly to the first preferred embodiment. The ZnO film 13 with a low resistance functions as an electrode. That is, the ZnO film 13 functions as an electrode electrically connected to the electrode 16, and functions so as to apply an electric field between the piezoelectric film 14 and the electrode 15. The ZnO film 13 with a low resistance is formed similarly to the first preferred embodiment. Accordingly, the specific resistance is for example, about $10^{-5}$ Ω·cm. The specific resistance is preferably 1 Ω·cm or less and more preferably $8\times10^{-4}$ Ω·cm or less.

The piezoelectric film 14 on the ZnO film 13 is formed by use of the same material as that for the piezoelectric film 4 in the first preferred embodiment. That is, a piezoelectric material having a lattice constant which is within approximately ±20% of the lattice constant of ZnO, and a specific resistance ρ of at least about $10^6$ Ω·cm, such as AlN and GaN is preferably used to form the piezoelectric film 14.

The electrodes 15 and 16 can be formed by use of an appropriate metal material such as Al, Au, Cu, or other suitable material.

Also in this preferred embodiment, the ZnO film 13 with a low resistance is formed similarly to the ZnO film 3 in the first preferred embodiment. The piezoelectric film 14 of the above-described piezoelectric material is formed thereon. Accordingly, the ZnO film 13 and the piezoelectric film 14 are formed as epitaxial films. That is, since the piezoelectric film 14 is oriented in the direction of (110), a high frequency transducer for use in a high frequency range of 200 MHz to 2 GHz can be formed.

This will be described with reference to the specific experimental examples.

The shear bulk wave transducer 11 of the present preferred embodiment was formed by use of the following materials. That is, the ZnO film 13 with a low resistance, having a thickness of about 0.3 μm was formed on the substrate 12 made of approximately 32° to approximately 42° rotated Y-plate $LiTaO_3$, having approximate dimensions of 10 mm×5 mm×0.35 mm. The conditions of the sputtering are as follows.

Film-Forming Condition of ZnO Film 13

Rf magnetron sputtering, target of Zn doped with 1% of Al, substrate heating temperature 250° C., RF power 1 KW, introduction gas $Ar+O_2$, gas pressure 7×10−3 Torr Succeedingly, on the ZnO film 13, a ZnO film as the piezoelectric film 14 having a thickness of about 2.9 μm was formed. The film-forming conditions of the ZnO film are as follows.

Film-Forming Condition of Piezoelectric Film 14

Figure 4:
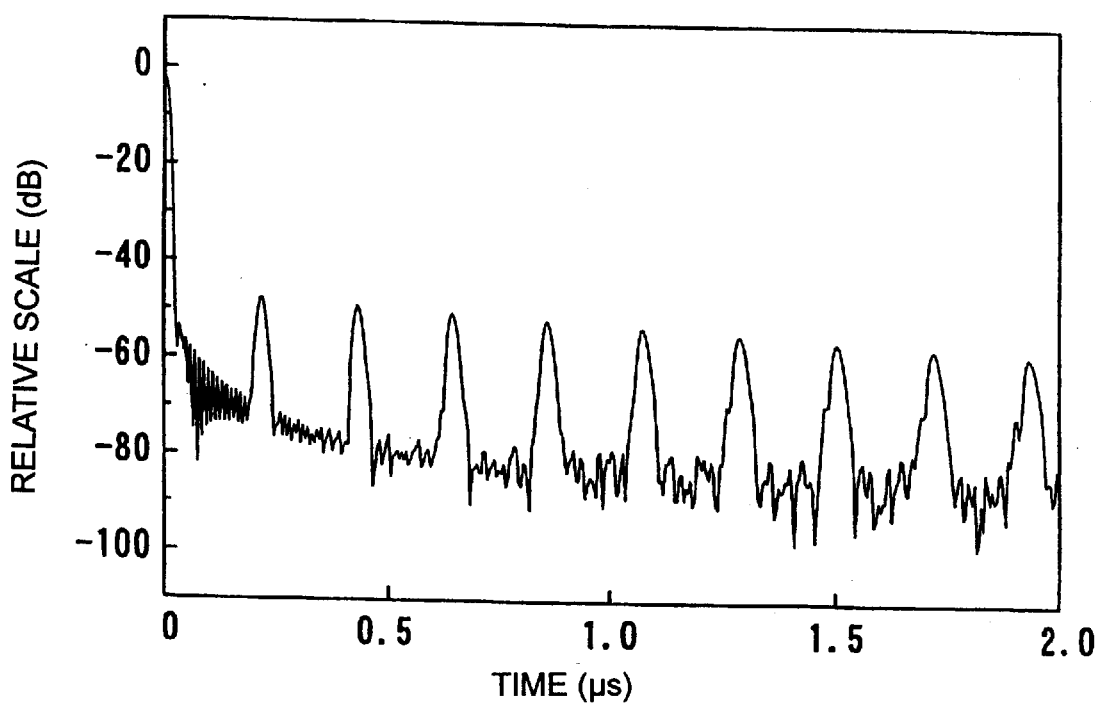
FIG. 4 illustrates a reflection time characteristic measured on the front and back surfaces of the shear bulk wave transducer according to the second preferred embodiment.
Figure 5:
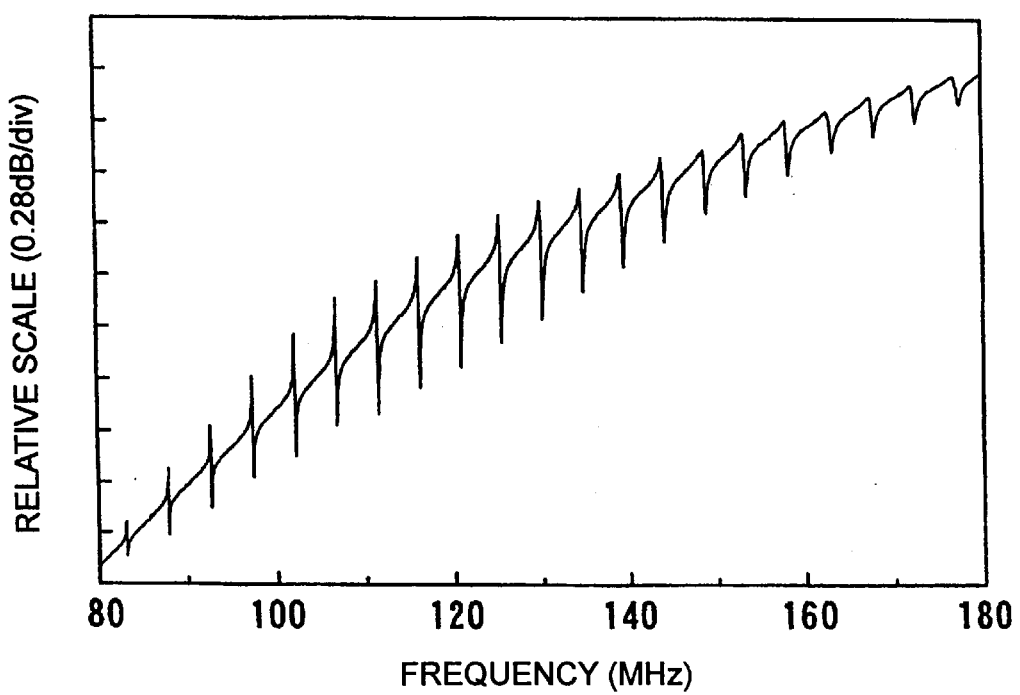
FIG. 5 illustrates the admittance-frequency characteristic of the shear bulk wave transducer according to the second preferred embodiment.

Rf magnetron sputtering, 99.99% Zn target, substrate heating temperature 200° C., RF power 1 KW, introduction gas $Ar+O_2$, gas pressure $7\times10^{-3}$ Torr The electrodes 15 and 16 made of Al (aluminum) were formed on the piezoelectric film 14 and the ZnO film 13 formed as described above. Thus, the shear bulk wave transducer 11 was obtained. FIGS. 4 and 5 show the characteristics of the shear bulk wave transducer 11. FIG. 4 shows a time-response. FIG. 5 shows the frequency-amplitude characteristic. FIGS. 4 and 5 show the time and the amplitude at which a shear bulk wave excited in the ZnO is propagated, is reflected from the back side to be returned, and is reflected from the front side of the substrate, that is, the shear bulk wave is repeatedly reflected from the front and back sides of the substrate. As seen in the time periods shown in FIG. 4 and the frequency intervals shown in FIG. 5, according to this preferred embodiment, a shear bulk wave transducer for operation in a high frequency range can be provided.

In the first and second preferred embodiments of the present invention, the substrates 1 and 11 made of the R-plane sapphire are preferably used. However, in this invention, as the substrate, various types of substrate materials can be used. When approximately 30° to approximately 42° rotated Y-plate $LiRaO_3$ substrates are used, for example, a piezoelectric film having an orientation of (11$\bar{2}$0) or (10$\bar{1}$0) an be formed on the ZnO film with a low resistance, thereby realizing a shear bulk wave transducer.

On the other hand, when c-plane sapphire, sapphire having a plane parallel to the c axis such as m-plane sapphire and a-plane sapphire, Z-cut quartz,and (111), (100) or (011) are used, an epitaxial piezoelectric film having an orientation of (0001) can be formed on the ZnO film with a low resistance. That is, a good longitudinal bulk wave transducer can be formed. Accordingly, when these substrate materials are used, the surface acoustic wave device or the longitudinal wave transducer can be also formed according to the first and second preferred embodiments, as in the case in which the substrate made of the R-plane sapphire is used. Thus, the same advantages as those of the first and second preferred embodiments can be obtained.

In the surface acoustic wave device of various preferred embodiments of the present invention, the electrode made of the ZnO layer with a low resistance on the substrate, the piezoelectric film with a high resistance on the ZnO layer, and the interdigital electrode formed on the piezoelectric film are laminated to each other. Therefore, a large electromechanical coefficient is achieved. Accordingly, the insertion loss is greatly decreased, and the conversion efficiency is greatly improved. Moreover, the surface acoustic wave device is significantly reduced in size.

When a substrate made of R-plane sapphire, sapphire having a plane parallel to the c axis (m-plane sapphire, a-plane sapphire), c-plane sapphire, Z-cut quartz, 30° to 42° rotated Y-plate $LiNbO_3$, or 30° to 42° rotated Y-plate $LiTaO_3$ are used as the above-described substrate, the piezoelectric film which is epitaxial and has an orientation of (11$\bar{2}$0) or (0001) can be securely formed. Thus, a surface acoustic wave device according to preferred embodiments of the present invention can be easily provided.

When a doping impurity is added at a ratio of about 3% to about 5% by weight based on 100% by weight of ZnO, the specific resistance of the ZnO layer with a low resistance is greatly reduced. Thus, the ZnO layer with a low resistance can be securely made to function as an electrode.

Since Al, Ga, V, Nb, or As is used as the above impurity, the specific resistance of the ZnO layer with a low resistance can be securely decreased.

In the shear bulk wave transducer of various preferred embodiments of the present invention, on the substrate made of approximately 30° to 42° rotated Y-plate $LiNbO_3$ or approximately 30° to approximately 42° rotated Y-plate $LiTaO_3$, the electrode made of a ZnO film with a low resistance, the piezoelectric film with a relatively high resistance formed as an epitaxial film on the electrode made of the ZnO with a low resistance, and the electrode on the piezoelectric film are laminated. Thus, a shear bulk wave transducer for operation in a high frequency range, using a transverse bulk wave can be provided.

In the shear bulk wave transducer, when at least one of the atoms or molecules belonging to the groups IIIA, IIIB, VA, and VB, more specifically, Al, Ga, V, Nb, or As is used as an impurity, the specific resistance ρ of the ZnO film with a low resistance can be securely reduced. Thus, the ZnO film with a low resistance can be securely made to function as an electrode.

Similarly, by formation of an epitaxial piezoelectric film having an orientation of (0001) on a substrate made of c-plane sapphire, sapphire having a plane parallel to the c axis such as a-plane sapphire and m-plane sapphire, Z-cut quartz and (111), (100) or (011) silicon, a longitudinal bulk wave transducer with a high efficiency can be provided.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:

a substrate;

an electrode disposed on the substrate, having a specific resistance of up to about 1 $\Omega \cdot$cm, and including a ZnO layer with a low resistance, having an impurity doping the ZnO;

a piezoelectric film arranged as an epitaxial film on the electrode including the ZnO layer, and having a specific resistance of at least about $10^6$ $\Omega \cdot$cm and a lattice constant within approximately ±20% of that of ZnO; and an interdigital electrode disposed on the piezoelectric film; wherein the substrate is made of a material selected from the group consisting of R-plane sapphire, c-plane sapphire, sapphire having a plane parallel to a c axis, (111), (100) or (011) silicon, Z-cut quartz, approximately 30° to approximately 42° rotated Y-plate LiNbO$_3$, and approximately 30° to approximately 42° rotated Y-plate LiTaO$_3$.

2. A surface acoustic wave device according to claim 1, wherein the ZnO layer is arranged to define a short circuit electrode.

3. A surface acoustic wave device according to claim 1, wherein the doping impurity is added at a ratio of about 3% to about 5% by weight based on 100% by weight of ZnO.

4. A surface acoustic wave device according to claim 1, wherein the impurity is one of the atoms and molecules belonging to the groups IIIA, IIIB, VA, and VB.

5. A surface acoustic wave device according to claim 4, wherein the impurity contains at least one element selected from the group consisting of Al, Ga, V, Nb, and As.

6. A surface acoustic wave device according to claim 1, wherein the surface acoustic wave device is arranged to generate a Sezawa wave.

7. A shear bulk wave transducer comprising:

a substrate made of one material selected from the group consisting of approximately 30° to approximately 42° rotated Y-plate LiNbO$_3$ and approximately 30° to approximately 42° rotated Y-plate LiTaO$_3$;

an electrode disposed on the substrate, having a specific resistance of up to about 1 $\Omega \cdot$cm, and made of a ZnO film with a low resistance, having an atom or molecule belonging to group IIIA, IIIB, VA, or VB as an impurity doping the ZnO;

a piezoelectric film arranged as an epitaxial layer on the electrode made of the ZnO with a low resistance, and having a specific resistance $\rho$ of at least about $10^6$ $\Omega \cdot$cm, and a lattice constant within approximately ±20% of that of ZnO; and an electrode disposed on the piezoelectric film.

8. A shear bulk wave transducer according to claim 7, wherein the electrode is made of aluminum.

9. A shear bulk wave transducer according to claim 7, wherein the impurity is at least one material selected from the group consisting of Al, Ga, V, Nb, and As.

10. A longitudinal bulk wave transducer comprising:

a substrate made of a material selected from the group consisting of sapphire having a plane parallel to the c axis, c-plane sapphire, Z-cut quartz, and (111), (100) or (011) silicon;

an electrode disposed on the substrate, having a specific resistance of up to about 1 $\Omega \cdot$cm, and made of a ZnO film with a low resistance having as an impurity an atom or molecule belonging to group IIIA, IIIB, VA, or VB, doping the ZnO;

a piezoelectric film arranged as an epitaxial film on the electrode made of the ZnO with a low resistance, and having a specific resistance of at least about $10^6$ $\Omega \cdot$cm, and a lattice constant within approximately ±20% of that of ZnO; and an electrode disposed on the piezoelectric film.

11. A longitudinal bulk wave transducer according to claim 10, wherein the impurity is at least one element selected from the group consisting of Al, Ga, V, Nb, and As.

* * * * *